(12) United States Patent
Zhao

(10) Patent No.: US 10,868,084 B2
(45) Date of Patent: Dec. 15, 2020

(54) FOLDABLE DISPLAY PANEL

(71) Applicant: WUHAN CHINA STAR OPTOELECTRONICS SEMICONDUCTOR DISPLAY TECHNOLOGY CO., LTD., Hubei (CN)

(72) Inventor: Jinrong Zhao, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 16/469,155

(22) PCT Filed: Jan. 3, 2019

(86) PCT No.: PCT/CN2019/070201
§ 371 (c)(1),
(2) Date: Jun. 13, 2019

(87) PCT Pub. No.: WO2020/107642
PCT Pub. Date: Jun. 4, 2020

(65) Prior Publication Data
US 2020/0203441 A1    Jun. 25, 2020

(51) Int. Cl.
*H01L 27/00* (2006.01)
*H01L 27/32* (2006.01)
*H01L 51/00* (2006.01)

(52) U.S. Cl.
CPC ...... *H01L 27/3218* (2013.01); *H01L 27/3246* (2013.01); *H01L 27/3283* (2013.01); *H01L 51/0097* (2013.01); *H01L 2251/5338* (2013.01)

(58) Field of Classification Search
CPC .................. H01L 51/0097; H01L 27/3246
See application file for complete search history.

(56) References Cited

U.S. PATENT DOCUMENTS

| | | | |
|---|---|---|---|
| 10,043,421 B2 * | 8/2018 | Koo | G06F 1/1652 |
| 2015/0049428 A1 * | 2/2015 | Lee | G06F 1/1652 |
| | | | 361/679.27 |
| 2017/0117345 A1 * | 4/2017 | Seo | H01L 27/3276 |
| 2017/0169748 A1 * | 6/2017 | Chen | G09G 3/2003 |
| 2018/0284533 A1 * | 10/2018 | Chen | G02F 1/133514 |
| 2019/0139473 A1 * | 5/2019 | Zeng | G09F 9/301 |
| 2019/0206950 A1 * | 7/2019 | Chen | G02F 1/133514 |
| 2019/0228697 A1 * | 7/2019 | Zeng | G09G 3/2092 |

* cited by examiner

*Primary Examiner* — Caridad Everhart
*Assistant Examiner* — Ankush K Singal
(74) *Attorney, Agent, or Firm* — Mark M. Friedman

(57) ABSTRACT

A foldable display panel is provided. The foldable display panel includes a foldable area and two non-foldable areas. The foldable display panel further includes at least two pixel units. Each of the pixel units includes three sub-pixels. A pattern of the sub-pixel in the foldable area is elliptical or is curved quadrilateral. A pattern of the sub-pixel in the non-foldable area is a rhombus. An ability of the sub-pixels located in the foldable area 100 to withstand stress during a bending process is enhanced. Detachment of an electroluminescent layer or a thin film encapsulation layer located in the foldable area is prevented, thereby a reliability of a display device is ensured and a quality of the product is improved.

9 Claims, 2 Drawing Sheets

FOLDABLE DISPLAY PANEL

FIELD OF INVENTION

The present disclosure relates to display technologies, and more particularly to a foldable display panel.

BACKGROUND OF INVENTION

A display panel is composed of many pixels, and in order for each individual pixel to display a variety of colors, each pixel needs to be divided into red, green and blue sub-pixels. That is to say, the three sub-pixels constitute a whole pixel, that is, a color pixel. When it is necessary to display different colors, the three sub-pixels respectively emit light with different brightness, and because a surface area of the sub-pixel is very small, it is visually mixed into a desired color. A sub-pixel arrangement is arranged in red, green, blue (RGB) arrangement, pixel arrangement (PenTile), and diamond arrangement.

The RGB arrangement is the most standard arrangement. It divides a square pixel into three equal parts, each of which is given a different color, so that a color pixel can be formed. In fact, most liquid crystal displays use standard RGB sub-pixel arrangement. Its advantage is that pixel independence is high, and each pixel can display all the colors by itself. But the disadvantage is that when one wants to make a m*n display, a total of 3 m*n pixels needs to be made.

One pixel in the RGB pixel arrangement (PenTile) is different from that in the standard RGB arrangement. The pixel in the standard RGB arrangement is composed of three sub-pixels of red, green, and blue, while the pixel in PenTile has only two sub-pixels of "red-green" or "blue-green". Compared with the standard RGB sub-pixel arrangement on displaying 3×3 pixels, RGB pixel arrangement only needs 6 sub-pixels in a horizontal direction, while standard RGB arrangement needs 9 sub-pixels. Numbers of sub-pixels in RGB pixel arrangement are reduced by ⅓. Technology of "shared sub-pixels" between adjacent pixels in the RGB pixel arrangement can reduced by ⅓ of the sub-pixels while keeping the total pixels unchanged, thereby achieving the result of displaying 3×3 full-color pixels.

At present, in order to meet the needs of a smaller bending radius of future folding display products, it is necessary to continuously innovate and patent the layout design of thin film transistor (TFT) display panels. In current flexible display product design, sub-pixel arrangements and sub-pixel patterns of a bending area and a non-bending area of a display screen is basically the same. The sub-pixels of the bending area and the non-bending area are arranged in PenTile arrangement, and the sub-pixel pattern is oblique square. However, in an actual folding process of products, film layers of the bending area of the TFT are subjected to external tensile force and pressure much more than those of the non-bending area. When a bending portion crosses the diagonal of the square of the sub-pixel, diagonal corners of the square sub-pixel tend to be subjected to stress concentration, and it is prone to cause an electro-luminescence (EL) layer or thin film encapsulation (TFE) layer therein to fall off.

Therefore, the prior art has drawbacks and is in urgent need of improvement.

SUMMARY OF INVENTION

In view of the above, the present disclosure provides a foldable display panel to solve the problem of stress concentration of the diagonal corners or protrusion of the sub-pixels located in the bending area, the technical problem of electroluminescent layer or film encapsulation layer falling off in the bending area is improved.

In order to achieve above-mentioned object of the present disclosure, one embodiment of the disclosure provides a foldable display panel including a foldable area and two non-foldable areas. The foldable display panel further includes at least two pixel units. Each of the pixel units includes three sub-pixels. A pattern of the sub-pixel in the foldable area is elliptical or is curved quadrilateral. A pattern of the sub-pixel in the non-foldable area is a rhombus.

In one embodiment of the disclosure, a curved quadrilateral shape includes two opposite curved edges and two parallel straight edges or includes two opposite curved edges and another two opposite curved edges.

In one embodiment of the disclosure, the foldable display panel further includes a fold axis crossed at least one of the sub-pixels when the foldable display panel is in a folded state.

In one embodiment of the disclosure, a fold radius of the foldable display panel in the folded state is equal to a half distance between the two non-foldable areas.

In one embodiment of the disclosure, a width of the foldable area of the foldable display panel in an unfolded state is equal to 2π times of the fold radius.

In one embodiment of the disclosure, the pixel units are arranged in an array.

In one embodiment of the disclosure, the three sub-pixels of the pixel units are first sub-pixel, second sub-pixel, and third sub-pixel. The first sub-pixels and the second sub-pixels are arranged in an array and in interval. The third sub-pixels are disposed between two adjacent first sub-pixels and between two adjacent second sub-pixels.

In one embodiment of the disclosure, the first sub-pixels are arranged in a line and in an equal interval. The second sub-pixels are arranged in a line and in an equal interval.

In one embodiment of the disclosure, an area of a surface of the second sub-pixel is less than an area of a surface of the first sub-pixel. An area of a surface of the third sub-pixel is less than an area of a surface of the second sub-pixel.

In one embodiment of the disclosure, the first sub-pixel is a blue pixel, the second sub-pixel is a red pixel, and the third sub-pixel is a green pixel.

In comparison with the prior art, the foldable display panel of the embodiments of the disclosure enhance the ability of the sub-pixel located in the foldable area to withstand stress during bending process by using an elliptical or curved quadrilateral sub-pixel pattern located in the foldable area. It prevents detachment of electroluminescence and the encapsulation film layer in the foldable area. Thereby a reliability of a display device is ensured and a quality of a product is improved.

REFERENCE NUMBERS OF THE PRESENT DISCLOSURE ARE AS FOLLOWS

1: pixel unit, 2: fold axis, 11: first sub-pixel, 12: second sub-pixel, 13: third sub-pixel, 100: foldable area, 200: non-foldable area, 101: curved quadrilateral shape, 1011: curved edge, and 1012: straight edge.

DETAILED DESCRIPTION OF PREFERRED EMBODIMENTS

The following description of the embodiments is provided by reference to the following drawings and illustrates the specific embodiments of the present disclosure. Directional terms mentioned in the present disclosure, such as "up," "down," "top," "bottom," "forward," "backward," "left," "right," "inside," "outside," "side," "peripheral," "central," "horizontal," "peripheral," "vertical," "longitudinal," "axial," "radial," "uppermost" or "lowermost," etc., are merely indicated the direction of the drawings. Therefore, the directional terms are used for illustrating and understanding of the application rather than limiting thereof.

Figure 1:
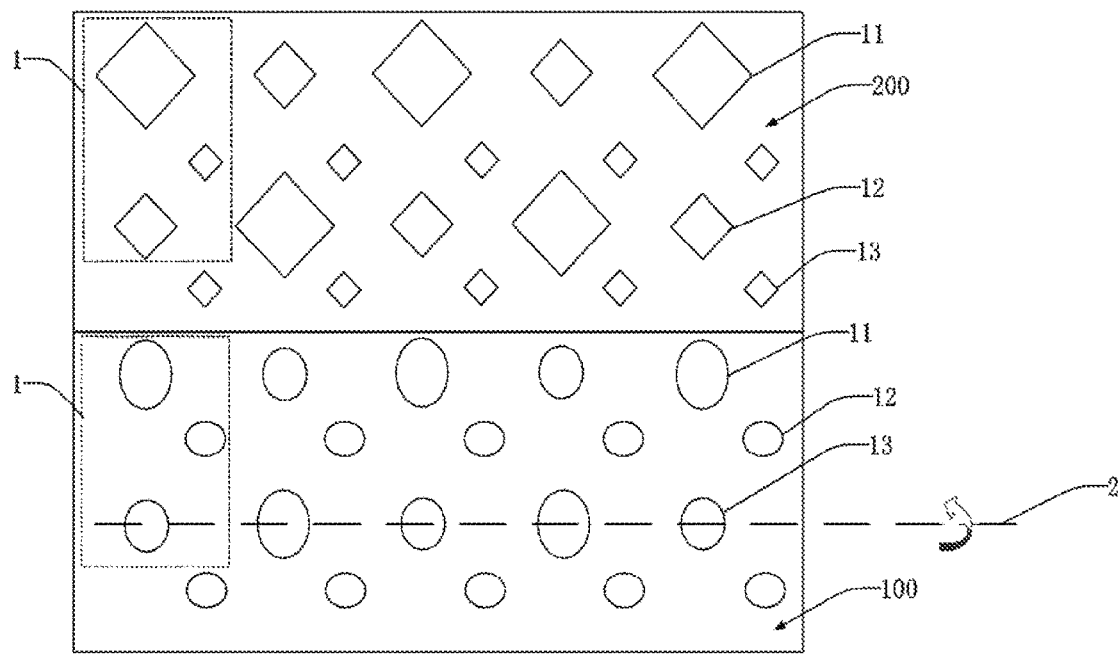
FIG. 1 is a schematic view of a structure with an elliptical sub-pixel according to an embodiment of the present disclosure.
Figure 2:
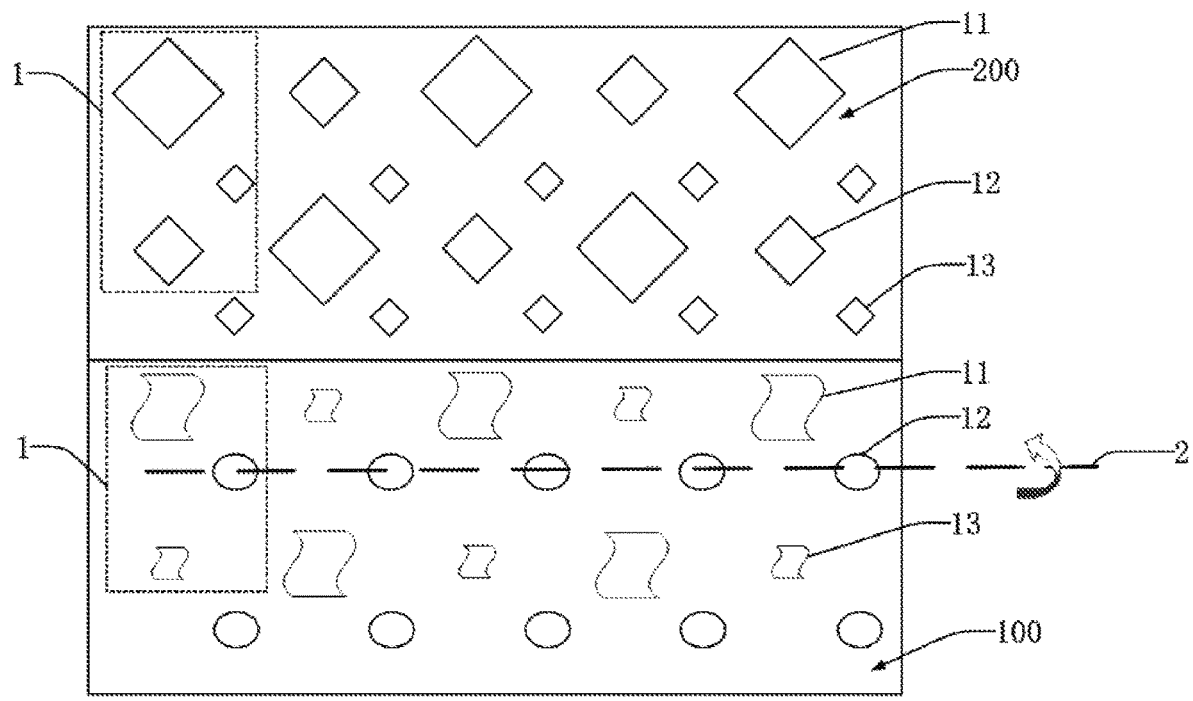
FIG. 2 is a schematic view of a structure with a curved quadrilateral sub-pixel according to an embodiment of the present disclosure.

One embodiment of the present disclosure provides a foldable display panel. It will be described separately as follows. Referring to FIGS. 1, and 2, one embodiment of the disclosure provides a foldable display panel including a foldable area 100 and two non-foldable areas 200. The foldable display panel further includes at least two pixel units 1. The pixel units are arranged in an array. Each of the pixel units 1 includes three sub-pixels. A pattern of the sub-pixel in the foldable area 100 is an elliptical shape or a curved quadrilateral shape 101. A pattern of the sub-pixel in the non-foldable area 200 is a rhombus.

The foldable display panel further includes a fold axis 2 in the foldable area crossed at least one of the sub-pixels when the foldable display panel is in a folded state. A fold radius of the foldable display panel in the folded state is equal to a half distance between the two non-foldable areas. A width of the foldable area of the foldable display panel in an unfolded state is equal to $2\pi$ timing the fold radius. Preferably, the width of the foldable area 100 is 20 mm, but the disclosure is not specifically limited it. It can be set according to actual needs by those skilled in the art.

As shown in FIG. 1, the sub-pixel pattern located in the foldable area 100 is elliptical, so that the sub-pixel can avoid sharp corners or protrusion. When the fold axis 2 passes through the sub-pixels, stress concentration can be effectively avoided. The pattern of the sub-pixels may be a circular shape in addition to the elliptical shape, as long as the stress concentration can be effectively avoided, and an ability of the sub-pixels located in the foldable area 100 to withstand stress during a bending process is enhanced. Detachment of an electroluminescent layer or a thin film encapsulation layer located in the foldable area is prevented, thereby a reliability of a display device ensured and quality of a product is improved.

A first sub-pixel 11 and a second sub-pixel 12 are spaced apart and arranged in an array. When the first sub-pixel 11 and the second sub-pixel 12 are on the same fold axis 2, color distribution of the pixels in the same direction can be more uniform. A third sub-pixel 13 is located between two adjacent first sub-pixels 11 and is located between two adjacent second sub-pixels 12, which can further make color display of a pixel structure more uniform.

In the present embodiment, the sub-pixel pattern located in the foldable area 100 may be composed of an ellipse, that is, all the sub-pixel patterns are elliptical. The pattern of the sub-pixels may also be a circular shape, in order to make the color display of the pixel structure more uniform and the ability of the sub-pixel to withstand stress during the bending process, and detachment of the electroluminescent layer or the thin film encapsulation layer located in the foldable area may be further prevented.

In detail, the three sub-pixels are respectively used to display three colors of red (R), green (G), and blue (B), wherein the first sub-pixel 11 and the second sub-pixel 12 are arranged in a row and equidistantly spaced. The third sub-pixel 13 is located between two adjacent first sub-pixels 11 and is located between two adjacent second sub-pixels 12, so that the color distribution of the pixel unit 1 is more uniform and the color effect is better. When a plurality of fold axes 2 are disposed in a sub-pixel region while passing through at least one sub-pixel in sequence, each fold axis 2 is parallel to each other.

In order to further make the color distribution of the pixel unit 1 uniform and the color effect better, a surface area of the second sub-pixel 12 is smaller than a surface area of the first sub-pixel 11, and a surface area of the third sub-pixel 13 is smaller than the second sub-pixel 12. In addition, any two of the adjacent sub-pixels display different colors.

The first sub-pixel 11 is for displaying blue, the second sub-pixel is for displaying display red, and the third sub-pixel 13 is for displaying green. The pixel unit 1 can be composed of the first sub-pixel 11, the second sub-pixel 12, and the third sub-pixel 13, for example. The pixel unit 1 can be configured by selecting other combinations according to actual needs. By setting the sub-pixels to an elliptical shape, an overall ability of the sub-pixels located in the foldable area 100 to withstand stress during the bending process is enhanced, the reliability of the display device is ensured and the reliability requirements of the product is met.

Figure 3:
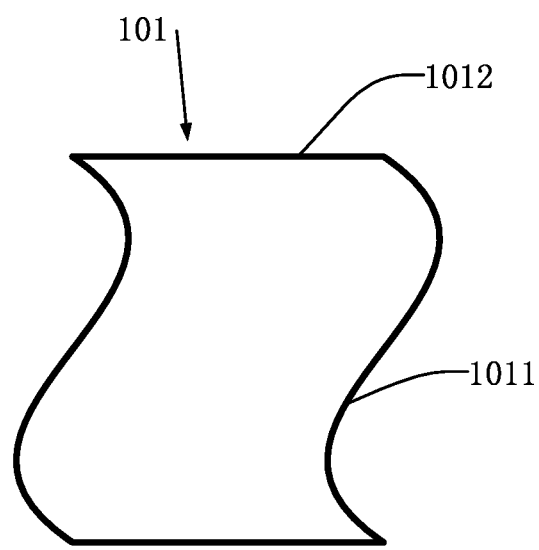
FIG. 3 is a schematic view of a structure of a curved quadrilateral shape according to an embodiment of the present disclosure.

Referring to FIGS. 2, and 3, a pattern of the sub-pixel in the foldable area 100 is a curved quadrilateral shape 101. The curved quadrilateral shape includes two opposite curved edges 1011 and two parallel straight edges 1012 or includes two opposite curved edges 1011 and another two opposite curved edges 1011. In detail, the curved quadrilateral shape includes two curved edges 1011 and two straight edges 1012 or includes four curved edges 1011. The pattern may be curved quadrilateral or curved multilateral. The disclosure does not limit this, as long as the stress concentration can be effectively avoided when the sub-pixels are located in the foldable area 100, the ability of the sub-pixels located in the foldable area 100 to withstand stress during the bending process is enhanced, and detachment of the electroluminescent layer or the thin film encapsulation layer located in the foldable area is prevented, thereby the reliability of the display device is ensured and the quality of the product is improved.

The first sub-pixel 11 and the second sub-pixel 12 are spaced apart and arranged in an array. When the first sub-pixel 11 and the second sub-pixel 12 are on the same fold axis 2, the color distribution of the pixels in the same direction can be more uniform. The third sub-pixel 13 is located between two adjacent first sub-pixels 11 and is located between two adjacent second sub-pixels 12, which can further make the color display of the pixel structure more uniform.

In the present embodiment, the patterns of the sub-pixels located in the foldable area 100 may be curved quadrilateral or elliptical, preferably, the first sub-pixels and the second sub-pixels are curved quadrilateral, and the third sub-pixels are elliptical, in order to make color display of the pixel structure more uniform and enhance an ability of the sub-pixel to withstand stress during the bending process. Detachment of the electroluminescent layer or the thin film encapsulation layer located in the foldable area may be further prevented.

In detail, the three sub-pixels are respectively used to display three colors of red (R), green (G), and blue (B), wherein the first sub-pixel 11 and the second sub-pixel 12 are arranged in a row and equidistantly spaced. The third sub-pixel 13 is located between two adjacent first sub-pixels 11 and is located between two adjacent second sub-pixels 12, so that color distribution of the pixel unit 1 is more uniform and color effect is better. When a plurality of fold axes 2 are disposed in the sub-pixel region while passing through at least one sub-pixel in sequence, each fold axis 2 is parallel to each other.

In order to further make the color distribution of the pixel unit 1 uniform and the color effect better, the surface area of the second sub-pixel 12 is smaller than the surface area of the first sub-pixel 11, and the surface area of the third sub-pixel 13 is smaller than the second sub-pixel 12. In addition, any two adjacent sub-pixels display different colors.

The first sub-pixel 11 is for displaying blue, the second sub-pixel is for displaying display red, and the third sub-pixel 13 is for displaying green. The pixel unit 1 can be composed of the first sub-pixel 11, the second sub-pixel 12, and the third sub-pixel 13, for example. The pixel unit 1 can be configured by selecting other combinations according to actual needs. By setting the sub-pixels to a curved quadrilateral shape, the overall ability of the sub-pixels located in the foldable area 100 to withstand stress during the bending process is enhanced, the reliability of the display device is ensured and the reliability requirements of the product is met.

In an embodiment of the disclosure, the pattern of the sub-pixels is set in a pixel definition layer and organic light emitting diode (OLED). A pattern of an anode layer depends on the requirements of the product, and an area and aperture ratio of the pixel depend on the product pixel per inch (PPI) and process capability. The pixel definition layer can be made of a common design material as in the conventional one. An organic photoresist material such as DL-1000 or DL-1001C can be used, or an ordinary photolithography process can be used. The OLED can be inkjet printing or evaporation. A fine metal mask (FMM) required for evaporation can be fabricated by etching, electroforming, laser or other new processes. In addition, there is no need to add additional masks, just change the design of existing pixel defining layer (PDL) mask and FMM.

The display device in the embodiment may be a liquid crystal display (LCD) or an OLED. The structure of the display device other than the pixel structure and the pixel pattern is the same as the prior art, and details are not described herein again.

The present disclosure has been described by the above embodiments, but the embodiments are merely examples for implementing the present disclosure. It must be noted that the embodiments do not limit the scope of the invention. In contrast, modifications and equivalent arrangements are intended to be included within the scope of the invention.

What is claimed is:

1. A foldable display panel, comprising:
   a foldable area; and
   two non-foldable areas, wherein the foldable display panel further comprises at least two pixel units, wherein each of the pixel units comprises three sub-pixels, a pattern of the sub-pixels in the foldable area is curved quadrilateral, a shape of the curved quadrilateral comprises two opposite curved edges and two parallel straight edges or comprises two opposite curved edges and another two opposite curved edges, and a pattern of the sub-pixels in the two non-foldable areas is a rhombus.

2. The foldable display panel according to claim 1, further comprising a fold axis crossed at least one of the sub-pixels when the foldable display panel is in a folded state.

3. The foldable display panel according to claim 1, wherein a fold radius of the foldable display panel in the folded state is equal to a half distance between the two non-foldable areas.

4. The foldable display panel according to claim 3, wherein a width of the foldable area of the foldable display panel in an unfolded state is equal to $2\pi$ times of the fold radius.

5. The foldable display panel according to claim 1, wherein the pixel units are arranged in an array.

6. A foldable display panel, comprising:
   a foldable area; and
   two non-foldable areas, wherein the foldable display panel further comprises at least two pixel units, wherein each of the pixel units comprises three sub-pixels, a pattern of the sub-pixels in the two foldable areas is elliptical or is curved quadrilateral, the three sub-pixels of the pixel units are first sub-pixels, second sub-pixels, and third sub-pixels, wherein the first sub-pixels and the second sub-pixels are arranged in an array and in interval, the third sub-pixels are disposed between two adjacent first sub-pixels and between two adjacent second sub-pixels, and a pattern of the sub-pixels in the two non-foldable areas is a rhombus.

7. The foldable display panel according to claim 6, wherein the first sub-pixels are arranged in a line and in an equal interval, and the second sub-pixels are arranged in a line and in an equal interval.

8. The foldable display panel according to claim 6, wherein an area of a surface of the second sub-pixel is less than an area of a surface of the first sub-pixel, and an area of a surface of the third sub-pixel is less than an area of a surface of the second sub-pixel.

9. The foldable display panel according to claim 6, wherein the first sub-pixel is a blue pixel, the second sub-pixel is a red pixel, and the third sub-pixel is a green pixel.

* * * * *

UNITED STATES PATENT AND TRADEMARK OFFICE
CERTIFICATE OF CORRECTION

PATENT NO. : 10,868,084 B2  
APPLICATION NO. : 16/469155  
DATED : December 15, 2020  
INVENTOR(S) : Jinrong Zhao Page 1 of 1

It is certified that error appears in the above-identified patent and that said Letters Patent is hereby corrected as shown below:

On the Title Page

Column 1, Insert:  
--(30) Foreign Application Priority Data  
November 27, 2018 (CN) 201811428010.X--

Signed and Sealed this  
Sixteenth Day of February, 2021

Drew Hirshfeld  
*Performing the Functions and Duties of the*  
*Under Secretary of Commerce for Intellectual Property and*  
*Director of the United States Patent and Trademark Office*